United States Patent
Kasorla et al.

(10) Patent No.: US 9,412,465 B2
(45) Date of Patent: Aug. 9, 2016

(54) RELIABLE READOUT OF FUSE DATA IN AN INTEGRATED CIRCUIT

(71) Applicant: Apple Inc., Cupertino, CA (US)

(72) Inventors: Yoav Kasorla, Kfar Netar (IL); Shai Ojalvo, Moshav Olesh (IL); Eyal Gurgi, Petah-Tikva (IL)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/821,254

(22) Filed: Aug. 7, 2015

(65) Prior Publication Data

US 2015/0348645 A1    Dec. 3, 2015

Related U.S. Application Data

(63) Continuation of application No. 14/269,833, filed on May 5, 2014, now Pat. No. 9,136,012.

(51) Int. Cl.
*G11C 17/18* (2006.01)
*G11C 17/16* (2006.01)
*G06F 11/10* (2006.01)
*G11C 29/00* (2006.01)

(52) U.S. Cl.
CPC ............ *G11C 17/18* (2013.01); *G06F 11/1044* (2013.01); *G11C 17/16* (2013.01); *G11C 29/74* (2013.01); *G11C 29/787* (2013.01)

(58) Field of Classification Search
CPC ....... G11C 17/18; G11C 17/16; G11C 29/785
USPC ............................... 365/225.7, 200
See application file for complete search history.

(56) References Cited

U.S. PATENT DOCUMENTS

| | | | |
|---|---|---|---|
| 6,915,476 B2 | 7/2005 | Morino et al. | |
| 7,116,590 B2 * | 10/2006 | Blodgett | G11C 29/787 365/200 |
| 7,266,025 B2 | 9/2007 | Nagai et al. | |
| 7,330,383 B2 | 2/2008 | Takai | |
| 7,411,845 B2 | 8/2008 | Kodama | |
| 7,796,441 B2 | 9/2010 | Kang et al. | |
| 8,339,830 B2 | 12/2012 | Yamauchi et al. | |
| 2008/0298128 A1 | 12/2008 | Kang et al. | |
| 2010/0220517 A1 | 9/2010 | Okayama | |
| 2012/0188830 A1 | 7/2012 | Jeong | |
| 2013/0322149 A1 | 12/2013 | Ryu et al. | |

* cited by examiner

*Primary Examiner* — Son Dinh
(74) *Attorney, Agent, or Firm* — Meyertons, Hood, Kivlin, Kowert & Goetzel, P.C.

(57) ABSTRACT

An integrated circuit includes fuse readout logic and first and second sets of fuses. One of the sets includes one or more primary fuses whose burn states represent respective bit values, and the other of the sets includes one or more secondary fuses whose burn states are indicative of the bit values stored in the primary fuses. The fuse readout logic is configured to read the bit values by sensing the burn states of the primary fuses, and to conditionally correct the read bit values by sensing the burn states of one or more of the secondary fuses.

20 Claims, 2 Drawing Sheets

RELIABLE READOUT OF FUSE DATA IN AN INTEGRATED CIRCUIT

PRIORITY INFORMATION

This application claims priority to U.S. patent application Ser. No. 14/269,833, entitled "Reliable Readout of Fuse Data in an Integrated Circuit," filed May 5, 2014, which is hereby incorporated by reference in its entirety as though fully and completely set forth herein.

TECHNICAL FIELD

The embodiments described herein relate generally to integrated circuits, and particularly to methods and systems for reading data stored in fuses.

BACKGROUND

Some integrated circuits (ICs) comprise one or more fuses for storing unchanging data. Fuses can store data bits whose values correspond to whether the fuses are burned or not. Various methods for storing data in fuses within Integrated Circuits (ICs) are known in the art. For example, U.S. Patent Application Publication 2013/0322149, whose disclosure is incorporated herein by reference, describes a memory device that includes a memory cell array and a fuse device. The fuse device includes a fuse cell array and a fuse control circuit. The fuse cell array includes a first fuse cell sub-array which stores first data associated with operation of the fuse control circuit, and a second fuse cell sub-array which stores second data associated with operation of the memory device. The fuse control circuit is electrically coupled to the first and second fuse cell sub-arrays, and is configured to read the first and second data from the first and second fuse cell sub-arrays, respectively.

U.S. Patent Application Publication 2012/0188830, whose disclosure is incorporated herein by reference, describes a semiconductor memory device and a method for operating the memory device. The semiconductor memory device includes a first anti-fuse array having a plurality of first anti-fuse elements that store first fuse data, a second anti-fuse array having a plurality of second anti-fuse elements that store error correction code (ECC) data associated with the first fuse data. An ECC decoder is configured to generate second fuse data by correcting the first fuse data using the ECC data.

U.S. Pat. No. 7,266,025, whose disclosure is incorporated herein by reference, describes a semiconductor integrated circuit, in which fuse data is supplied to each of a plurality of function blocks through a transfer path using shift registers. A decoder is arranged in the transfer path of the fuse data, and encoded data is stored in the fuse elements.

SUMMARY OF THE EMBODIMENTS

An embodiment provides an integrated circuit that includes fuse readout logic and first and second sets of fuses. One of the sets includes one or more primary fuses whose burn states represent respective bit values, and the other of the sets includes one or more secondary fuses whose burn states are indicative of the bit values stored in the primary fuses. The fuse readout logic is configured to read the bit values by sensing the burn states of the primary fuses, and to conditionally correct the read bit values by sensing the burn states of one or more of the secondary fuses.

In some embodiments, the burn states of the secondary fuses duplicate the respective burn states of the primary fuses. In other embodiments, the fuse readout logic is configured to randomly select one of the first and second sets of fuses to serve as the primary fuses, and to select the other set of fuses to serve as the secondary fuses. In yet other embodiments, the fuse readout logic is configured to conditionally correct the read bit values by identifying one or more of the primary fuses that are in a non-burned state, and sensing only the secondary fuses whose burn states duplicate the burn states of the identified primary fuses.

In an embodiment, the bit values include data bits and redundancy bits that are indicative of errors in the data bits, and the fuse readout logic is configured to read the bit values, including the redundancy bits, and to sense the secondary fuses only when the redundancy bits indicate one or more errors in the data bits. In another embodiment, the redundancy bits include a Berger code that is calculated over the data bits. In yet another embodiment, the fuse readout logic is configured to correct the read bit values by combining sense results of the one or more of the secondary fuses with the bit values read from the primary fuses.

In some embodiments, the fuse readout logic is configured to combine the sense results with the bit values by performing a bitwise logical OR operation.

There is additionally provided, in accordance with another embodiment, a method including, in an integrated circuit that includes first and second sets of fuses, one of the sets including one or more primary fuses whose burn states represent respective bit values and the other of the sets including one or more secondary fuses whose burn states are indicative of the bit values stored in the primary fuses, reading the bit values by sensing the burn states of the primary fuses. The read bit values are conditionally corrected by sensing the burn states of one or more of the secondary fuses.

These and other embodiments will be more fully understood from the following detailed description, taken together with the drawings in which:

DETAILED DESCRIPTION OF EMBODIMENTS

Overview

Figure 1:
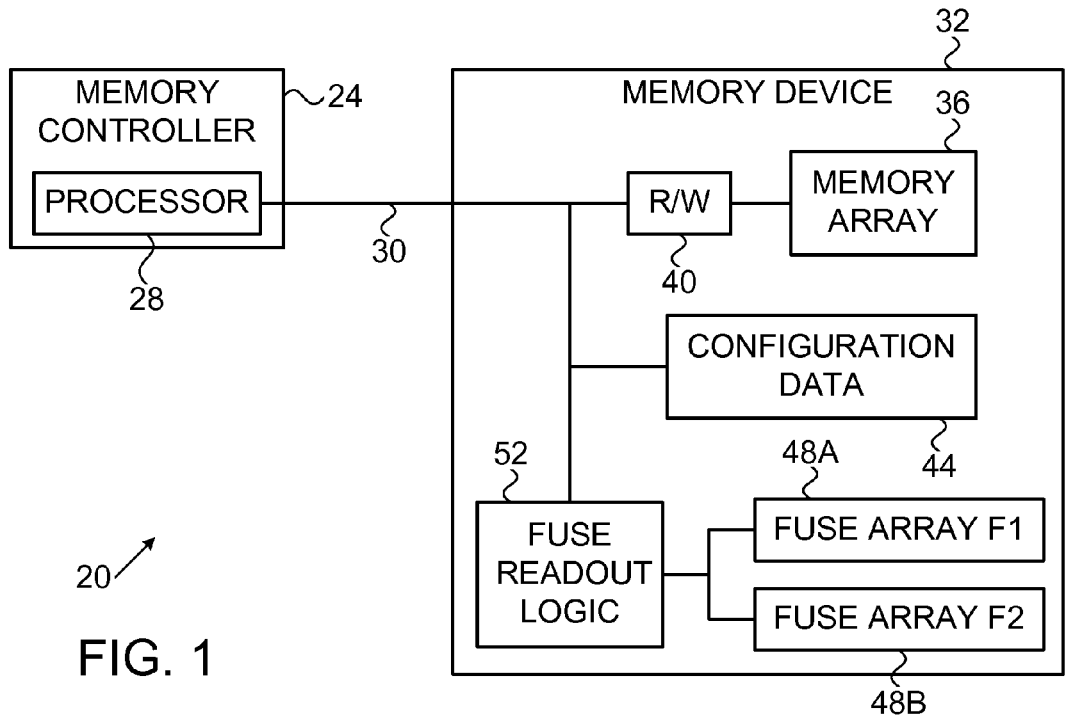
FIG. 1 is a block diagram that schematically illustrates a storage system in which data is stored in fuses, in accordance with an embodiment.

Some Integrated Circuits (ICs) store data that does not change during the lifetime of the IC. Such unchanging data may comprise identification data, configuration data, and the like. ICs can store constant data, for example, using one or more fuse elements. A fuse element can typically be configured or programmed to one of two states according to its burn state. A fuse typically starts in a non-burned state, and can be selectively programmed to a burned state during production of the IC. A fuse is capable of storing a single data bit that represents its burn state (or simply state for brevity), and thus, a set of N fuses can store N data bits. The data stored in fuses is referred to herein as "fuse data".

The data to be stored in fuses is typically determined during production. For example, during the production of some memory devices, configuration data, such as calibration data regarding timing optimization of the input/output bus of the memory device, is determined and stored in one or more fuses on the memory device, and/or on a memory controller that manages the device. The memory device may read the configuration data from the fuses when needed, such as, for example, on power-up, and apply the configuration accordingly.

Some fuses comprise a passive element, (e.g., a resistive element), whose state relates to its impedance. Prior to burning, the fuses typically comprise low impedance, and when burned, the impedance of the fuse typically increases significantly or the fuse becomes non-conductive.

To read the data bit value stored in a fuse, the IC typically senses the state of the fuse, for example, by evaluating some physical quantity that is related to the impedance of the fuse (e.g., the level of the electrical current that flows through the fuse). In the description that follows we assume that the IC assigns a '1' bit to the non-burned (low impedance) state and a '0' bit to the burned (high impedance) state. In alternative embodiments, however, the IC can assign a '1' bit to the burned state and a '0' bit to the non-burned state.

The reliability of reading the fuse data typically depends on the state to which the fuse is programmed. In contrast to burned fuses that retain their high impedance value throughout the lifetime of the IC, the impedance (and therefore the sensed state) of non-burned fuses may change over time and usage. For example, although at first sensing the low impedance of the non-burned fuse is reliable, after reading the fuse a certain number of times (e.g., on the order of 1-2 million), the reading reliability typically degrades, as the impedance of the fuse increases to a level that can be erroneously interpreted as the high impedance state. This degradation in reading reliability is referred to herein as an "aging effect.".

Note that since the aging effect refers mainly to non-burned fuses, errors in the read fuse data are typically asymmetrical and largely unidirectional. In other words, reading a '1' bit indicates a non-burned state with high reliability, whereas reading a '0' bit may erroneously indicate that the fuse is burned even though the fuse was never burned, but after applying a large number of read operation its impedance has increased and is now sensed as the high impedance state. The extent of asymmetry typically increases over the lifetime of the IC.

In principle, to increase the reliability of reading fuse data, the IC can be configured to store duplicate copies of the fuse data in two or more fuse arrays, and upon reading, to derive the fuse data by combining the data read from the duplicate copies. Since, however, reading each of the fuses involves a separate sensing operation, the overall reading time and power consumption increases linearly with the number of fuses and duplicates. Moreover, since in each reading operation of the fuse data the IC reads the fuses of all the duplicates, all the fuse arrays undergo a similar number of reading operations and therefore suffer a similar aging effect.

Embodiments that are described herein provide improved methods and systems for reading fuse data. In the disclosed techniques the fuse data is stored in a fuse array denoted F1 and is duplicated in another fuse array denoted F2. Thus, each fuse in F2 has a corresponding fuse in F1, programmed to the same burn state.

Since (as explained above) reading '1' is assumed reliable and only '0' bits may be erroneous, in some embodiments the IC first reads the fuses in F1 and identifies F1 fuses that are in the burned state (a '0' bit in the convention used herein). The IC then reads only the fuses in F2 that correspond to the fuses identified as burned in F1. For the fuses read from both F1 and F2, the IC derives the final fuse data by performing a bitwise logical OR operation between the data bits read from F1 and from F2. For the other fuses, the data bits read from F1 (which are all '1's) serve as the final fuse data.

In another embodiment, instead of consistently starting with reading the fuses of F1, the IC randomly selects (typically with equal probabilities) which of the fuse arrays F1 or F2 to start with. Then, similarly to the previous embodiment, the IC derives the fuse data by reading the fuses of the selected fuse array, and a subset of the fuses of the other array that correspond to fuses in the selected array that read a '0' bit. Since in this scheme the IC starts with each of the fuse arrays about half of the times, the number of reading operations before the aging effect becomes significant approximately doubles.

In yet another embodiment, in addition to storing the data bits, fuse array F1 comprises one or more additional fuses that store redundancy bits of an Error Correction Code (ECC) or Error Detection Code (EDC) computed over the data bits. In some embodiments, the code comprises a Berger code, which can detect any number of unidirectional errors in the data bits. The IC first reads the F1 fuses including the redundancy bits and checks for errors. If the code detects no errors, the data read from F1 is assumed reliable and output as the read fuse data. Otherwise, the IC identifies F1 fuses that read a '0' bit, and reads the corresponding F2 fuses.

In the disclosed techniques, instead of reading both fuse arrays per each reading operation of the fuse data, the IC reads one of the fuse arrays or part thereof only conditionally, to correct the data read from the other array as needed. As a result, the average number of sense operations per fuse data bit, and therefore the duration of reading the fuse data and the power consumption, reduces. Additionally, the number of reading operations that can be applied before the reading reliability degrades increases considerably. The embodiments described herein refer to two fuse arrays, but the disclosed techniques are applicable to any suitable number of fuse arrays.

System Description

FIG. 1 is a block diagram that schematically illustrates a storage system 20 in which constant data is stored in fuses, in accordance with an embodiment. System 20 can be used in various host systems and devices, such as in computing devices, cellular phones or other communication terminals, removable memory modules, Solid State Drives (SSD), digital cameras, music and other media players and/or any other system or device in which data is stored and retrieved. In alternative embodiments, system 20 may comprise any other suitable Integrated Circuit (IC), or multiple ICs, that store at least some constant data in fuses.

In the example of FIG. 1, system 20 comprises a memory controller 24, which stores data in a memory device 32 and retrieves data stored in the memory device. The memory controller comprises a processor 28 that carries out the various tasks of the controller. Memory device 32 stores the data received from the memory controller in a memory cell array 36. The memory array comprises multiple memory cells, such as, for example, analog memory cells of any suitable type. The memory controller communicates with the memory device over a bus 30.

In the example of FIG. 1, memory device 32 comprises a reading/writing (R/W) unit 40, which converts data for storage in the memory device to storage values and writes them into the memory cells. When reading data out of array 36, R/W unit 40 converts the storage values of the memory cells into digital samples (also referred to as alphabet symbols) having a resolution of one or more bits.

In some embodiments, memory device 32 operates according to certain configuration data stored in a configuration data unit 44. In some embodiments, the configuration data comprises calibration data that may be determined during production. For example, the configuration data may comprise a configuration that optimally calibrates the timing skew among data, address, and control signals delivered over bus 30. Alternatively or additionally, the configuration data may comprise any other suitable data that is part of the device configuration.

Memory device 32 further comprises two fuse arrays 48A and 48B, denoted F1 and F2, respectively, and fuse readout logic 52. Each of the fuse arrays 48A and 48B comprises one or more fuses for storing constant data. Typical data that can be stored in fuses may comprise, for example, boot configuration data, information regarding faulty memory locations in SRAM that have been substituted with functional memory locations, and/or various production related data.

In the description that follows, fuse readout logic is also referred to as logic 52 for brevity. When requested (e.g., at power-up), logic 52 is configured to read fuse data that was programmed (e.g., at production) in the fuse arrays.

Fuse programming is typically done during the production of the IC. In some embodiments, prior to programming, the fuses in F1 and F2 comprise low impedance values, which represent the storage of a '1' bit. While programming the fuses in F1 and F2, fuses that should store a '1' data bit are retained in the non-burned (low impedance) state, and the fuses that should store a '0' data bit are programmed to the burned (high impedance) state.

When reading data stored in one of the fuse arrays F1 or F2, fuse logic 52 evaluates the states to which the respective fuses were programmed. For example, logic 52 can sense the impedance values of the fuses, or some other suitable physical quantities that relate to the impedance, such as, for example, the levels of the electrical currents that flow through the fuses. Logic 52 transforms the value of the sensed impedance or current into a respective binary value '0' or '1'.

Logic 52 further comprises logic that combines the data read from F1 and from F2 to derive the final read fuse data. The combining logic may perform a bitwise logical OR operation, a majority vote operation, or any other suitable operation between the bits read from the corresponding fuses in F1 and F2.

Fuse readout logic 52 can deliver the read fuse data to memory controller 24, to memory array 36, or to configuration data unit 44. In some embodiments, the fuse data comprises configuration data that logic 52 reads from the fuse arrays on power-up, and stores in configuration data unit 44.

As explained above, repetitive operations of sensing the states of the fuses degrades the reading reliability and may result in erroneous fuse data. Various techniques for reading the fuse data with reduced error rate are described further below. In the disclosed techniques, one of the fuse arrays stores certain fuse data, and the other fuse array stores redundancy data, such as, for example, a copy or duplicate of the fuse data. To read the fuse data back, logic 52 does not read the entire data stored in F1 and F2, but senses the states of a subset of the fuses in one fuse array based on the readout result of the other fuse array. Example embodiments for reading the fuse data are described below with reference to FIGS. 2-4.

Some or all of the elements of memory controller 24, may be implemented in hardware. Alternatively, the memory controller may comprise a microprocessor that runs suitable software, or a combination of hardware and software elements.

The configuration of FIG. 1 is an example memory system configuration, which is shown purely for the sake of conceptual clarity. Any other suitable memory (or other) system configuration can also be used. Elements that are not necessary for understanding the principles, such as various interfaces, addressing circuits, timing and sequencing circuits and debugging circuits, have been omitted from the figure for clarity. Although FIG. 1 shows a single memory device 32 for the sake of clarity, in alternative embodiments a single memory controller may control multiple memory devices 32.

Further alternatively, system 20 may comprise any other suitable IC other than memory device 32, or multiple ICs, that store constant data in fuses. The ICs may be controlled, or not, by some suitable controller other than memory controller 24.

In the exemplary system configuration shown in FIG. 1, memory controller 24 and memory device 32 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 24 can be implemented in software and carried out by a processor or other element of the host system (not shown).

In some embodiments, memory controller 24 comprises a general-purpose processor, which is programmed in software to carry out the functions described herein. The software may be downloaded to the processor in electronic form, over a network, for example, or it may, alternatively or additionally, be provided and/or stored on tangible media, such as magnetic, optical, or electronic memory.

In an embodiment, memory device 32 does not comprise a separate configuration data unit 44. In such an embodiment, the configuration data read by logic 52 from the fuse arrays can be stored in memory array 36, or used directly to configure the memory device.

In some embodiments, some of the elements that in the system of FIG. 1 reside within memory device 32, are implemented as part of memory controller 24. For example, configuration data unit 44, fuse arrays 48A and 48B, and/or fuse readout logic 52 may reside on memory controller 24. In such embodiments, implementing the functionality of fuse readout logic 52 can be done in hardware, software, or in combination of hardware and software.

Although system 20 stores fuse data in two fuse arrays F1 and F2, in alternative embodiments, any other number of fuse arrays, can also be used. The fuse arrays (or a subset thereof) may store duplicate or different fuse data. In an example embodiment comprising multiple fuse arrays, one or more of the fuse arrays store the fuse data, and one or more other fuse arrays store any suitable redundancy data, such as, for example, a bitwise inverse version of the fuse data.

Methods for Reading Fuse Data

Figure 2:
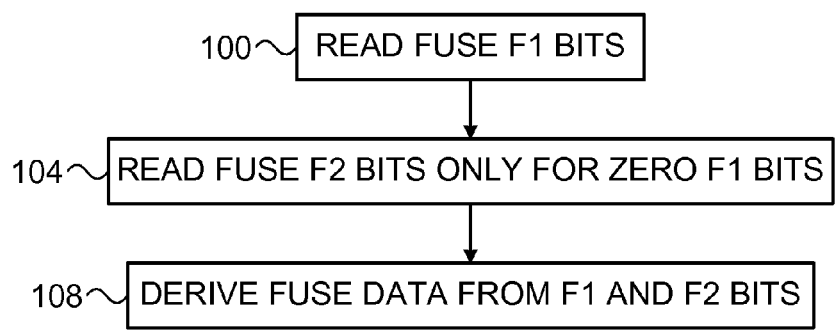
FIGS. 2-4 are flow charts that schematically illustrate methods for reading data stored in fuses, in accordance with three embodiments.
Figure 3:
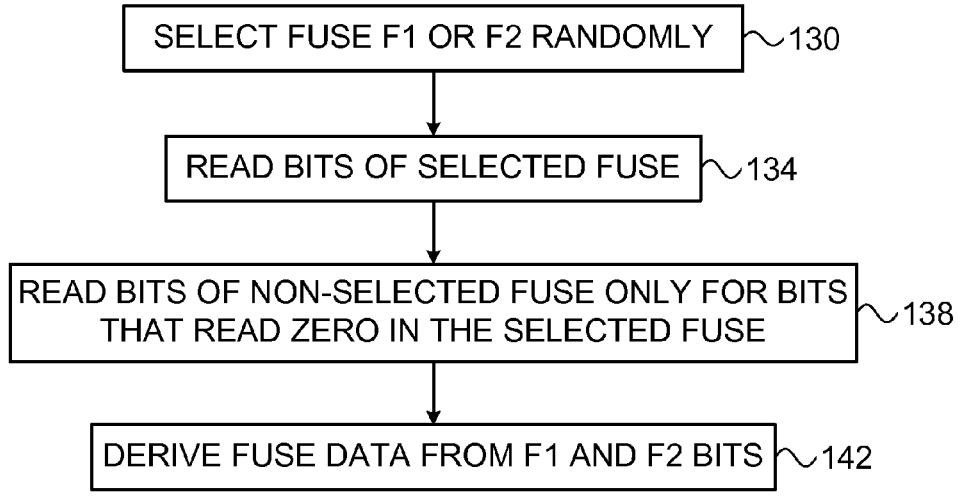
Figure 4:
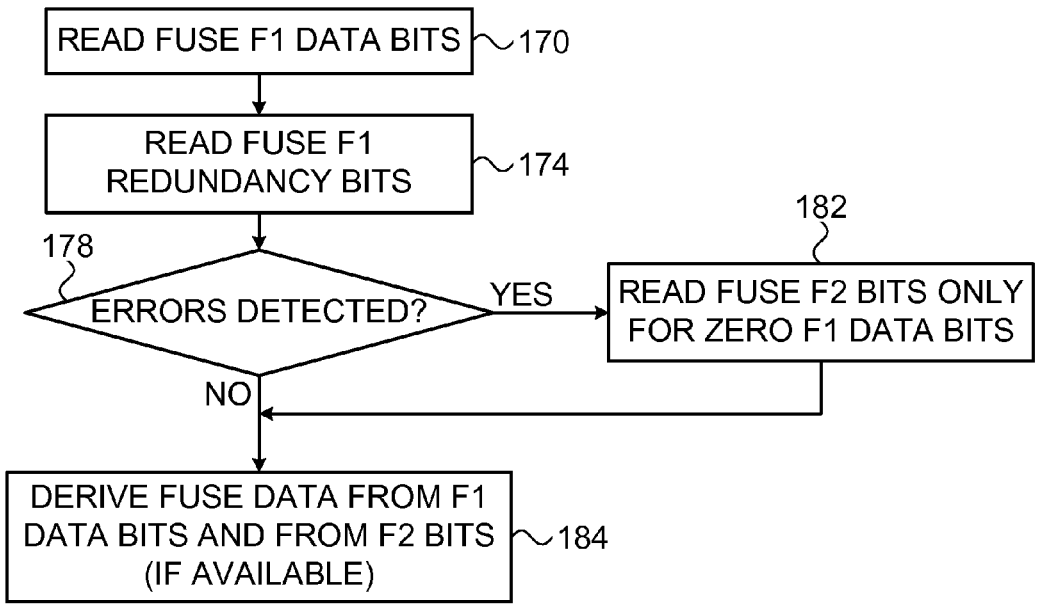

FIGS. 2-4 are flow charts that schematically illustrate methods for reading data stored in fuses, in accordance with three embodiments. The methods of FIGS. 2-4, are described as carried out by fuse readout logic 52. In alternative embodiments, these methods can be carried out by other elements within memory device 32, and/or by memory controller 24.

In the description that follows, we assume an N-bit fuse data with similar prevalence of '0' and '1' bits. The fuse data is stored duplicated in two N-fuse arrays (i.e., 2·N fuses in total). We additionally assume a reference reading scheme in which reading the fuse data involves reading all the 2·N fuses. We further assume that the reliability of fuse reading degrades significantly only after applying NR or more fuse sense operations. Thus, for the reference reading scheme, the number of fuse data read operations that can be applied before the reading reliability degrades equals NR, and the average number of fuse sense equals two operations per fuse data bit.

The method of FIG. 2 begins with logic 52 reading the data bits stored in the fuses of the F1 fuse array, at an F1 reading step 100. At an F2 reading step 104, logic 52 reads only the fuses in F2 that correspond to fuses in F1 that read a '0' bit at step 100. At a fuse data determination step 108, logic 52 combines the data bits read at steps 100 and 104, to derive the final read fuse data.

In some embodiments, logic 52 derives the final fuse data by outputting the '1' bits read at step 100, and the bits result from applying a bitwise logical OR operation between the data bits read from F2 at step 104 and the corresponding bits read from F1 at step 100. For this embodiment, since the prevalence of '0' and '1' is similar and as a result logic 52 reads only about half of the F2 fuses, the average number of fuse sense operations per fuse data bit equals 1.5. In addition, the number of fuse data read operations that can logic 52 can apply before the reading reliability degrades equals NR.

Alternatively, the memory device comprises multiple fuse arrays F1 . . . FM that store M>2 duplicates of the N-bit fuse data. In such embodiments, logic 52 reads at step 104 only a subset of the fuses in F2 . . . FN that correspond to fuses in F1 that read a '0' bit at step 100. Then, at step 108, logic 52 performs bitwise logical OR or a majority vote decision among the respective bits read from F1 . . . FM.

The method of FIG. 3 is similar to the method of FIG. 2, but instead of consistently starting with reading F1, logic 52 randomly selects the first fuse array to read from. The method begins with logic 52 selecting F1 or F2 randomly, e.g., with equal probabilities, at a selection step 130. Logic 52 may use any suitable method to randomize the selection, e.g., by using a pseudo-random binary sequence generator. In alternative embodiments, at step 130, instead of selecting randomly, logic 52 selects F1 and F2 alternately, or according to a predefined sequence in which F1 and F2 appear an equal (or similar) number of times.

At a first fuse array reading step 134, logic 52 reads the data bits from the fuse array that was selected at step 130. At a second fuse array reading step 138, logic 52 reads only the fuses of the array that was not selected at step 130, and that correspond to those fuses that read '0' at step 134. At a combining step 142, logic derives the final read fuse data, similarly to step 108 in the method of FIG. 2 above.

In the embodiment of FIG. 3, (similarly to the embodiment in FIG. 2) the average number of fuse sense operations per fuse data bit equals 1.5. The number of fuse data read operations that can be applied before the reading reliability degrades increases, however, from NR in the embodiment of FIG. 2, to 2·NR.

In the method of FIG. 4, we assume that the F1 fuse array comprises two sub-arrays. One sub-array stores the fuse data, and the other sub-array stores redundancy bits, to be used for detecting and/or correcting errors in the fuse data upon reading. The redundancy bits may comprise an Error Correction Code (ECC) or an Error Detection Code (EDC) calculated over the fuse data. In the example of FIG. 4, F2 stores a copy of the fuse data. Alternatively, F2 can store any other suitable redundancy data for correcting the fuse data read from F1.

Logic 52 can use any suitable ECC or EDC, such as, for example, a Hamming code or a Cyclic Redundancy Code (CRC). In some embodiments, the code comprises a Berger code, which can detect any number of unidirectional errors (e.g., such as in fuses in which a non-burned state can be erroneously indicate a burned state, but an error of the opposite direction is unlikely) in the fuse data. For N bits of data, the Berger code comprises $\log_2(N)$ bits. In general, codes that can correct up to t unidirectional errors and detect any number of unidirectional errors are also referred to as t-UEC/AUED codes.

The method of FIG. 4 begins with logic 52 reading the fuse data from the F1 at a data reading step 170. Logic 52 additionally reads the respective ECC/EDC bits from F1, at an ECC/EDC reading step 174. In some embodiments, steps 170 and 174 comprise a unified step. At an error detection step 178, logic 52 checks whether the data read at step 170 contains any errors. If at step 178 logic 52 detects one or more errors, logic 52 reads only the fuses in F2 that correspond to F1 fuses that read '0' at step 170, at a selective reading step 182.

At a combining step 184, logic 52 derives the final read fuse data from the F1 bits read at step 174, and from F2 bits if read at step 182. The combining operation at step 184 is similar to the one described at step 108 above.

Note that as long as reading the fuses in the F1 array is reliable, logic 52 detects no errors at step 178 and therefore skips step 182. This is in contrast to the methods of FIGS. 2 and 3. in which logic 52 typically reads fuses from both F1 and F2. In the method of FIG. 4, when the fuse data comprises N bits and the EDC comprises a Berger code, the average number of sense operations per bit equals $1+\log_2(N)/N$, which approaches unity as N increases.

Table 1 summarizes the performances of the reference scheme and the three embodiments described in FIGS. 2-4 according to two performance metrics. Metric_1 refers to the average required number of fuse sense operations per fuse data bit (when reading the fuse data is still reliable). Metric_2 refers to the number of fuse data read operations that can be applied before the reading reliability starts to degrade.

TABLE 1

| Embodiment/<br>Performance metric | Reference | FIG. 2 | FIG. 3 | FIG. 4 |
| --- | --- | --- | --- | --- |
| Metric_1 | 2 | 1.5 | 1.5 | $1 + \log_2(N)/N$ |
| Metric_2 | NR | NR | 2 · NR | NR |

The configurations described in the embodiments above are exemplary, and any other suitable configurations can also be used. For example, although in the disclosed embodiments fuse data is stored duplicated in two fuse arrays, the disclosed techniques are applicable to any suitable number of fuse arrays. For example, in an embodiment, configuration data whose reliability is critical for proper configuration of the IC may be duplicated in more than two fuse arrays.

As another example, in the method of FIG. 4, instead of using an error detection code, logic 52 can use an error correction code. Logic 52 skips step 182 when the data read from F1 contains no errors, or when all the errors are correctable by the ECC.

Although the embodiments in FIGS. 2-4 above are presented separately, various elements of one or more of the embodiments can be combined. For example, in the embodiment of FIG. 4, instead of reading F1 at step 170, logic 52 can randomly select to read F1 or F2 data bits similarly to step 130 in the embodiment of FIG. 3. At the subsequent steps, the selected array replaces F1, and the non-selected array replaces F2.

The techniques disclosed above refer to reading fuse data stored in fuse elements. Alternatively or additionally, the disclosed techniques can be used, mutatis mutandis, with anti-fuse elements, which in contrast to fuses start in a high impedance state and can be selectively programed to a low impedance state.

It will be appreciated that the embodiments described above are cited by way of example, and that the embodiments are not limited to what has been particularly shown and described hereinabove. Rather, the scope of the present disclosure includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An apparatus, comprising:
a first fuse array;
a second fuse array;
circuitry configured to:
  read a first set bit values from the first fuse array;
  read a set of redundancy bit values from the first fuse array;
  check the first set of bit values for errors dependent upon the set of redundancy bit values; and
  read at least one bit value from the second fuse array in response to a determination that at least one error is present in the first set of bit values.

2. The apparatus of claim 1, wherein the circuitry is further configured to generate a final set of data bits dependent upon the first set of bit values and the at least one bit value from the second fuse array.

3. The apparatus of claim 2, wherein to generate the final set of data bits dependent upon the first set of bit values and the at least one bit values from the second fuse array, the circuitry is further configured to perform a bitwise logical-OR operation.

4. The apparatus of claim 1, wherein the set of redundancy bit values include an Error Correction Code (ECC).

5. The apparatus of claim 1, wherein the set of redundancy bit values include an Error Detection Code (EDC).

6. The apparatus of claim 1, wherein to read the at least one bit value from the second fuse array, the circuitry is further configured to read the at least one bit value from the second fuse array in response to a determination that a corresponding bit value from the first set of bit values has a value of 0.

7. A method, comprising:
reading a first set bit values from a first fuse array;
reading a set of redundancy bit values from the first fuse array;
checking the first set of bit values for errors dependent upon the set of redundancy bit values; and
reading at least one bit value from a second fuse array in response to a determination that at least one error is present in the first set of bit values.

8. The method of claim 7, further comprising generating a final set of data bits dependent upon the first set of bit values and the at least one bit value from the second fuse array.

9. The method of claim 8, wherein generating the final set of data bits dependent upon the first set of bit values and the at least one bit value from the second fuse array includes performing a bitwise logical-OR operation.

10. The method of claim 7, wherein the set of redundancy bit values include an Error Correction Code (ECC).

11. The method of claim 7, wherein the set of redundancy bit values include an Error Detection Code (EDC).

12. The method of claim 7, wherein reading the at least one bit value from the second fuse array includes reading the at least one bit value from the second fuse array in response to a determination that a corresponding bit value from the first set of bit values has a value of 0.

13. The method of claim 7, wherein the first set of bit values includes information indicative of faulty locations in a memory.

14. A system, comprising:
a controller; and
a memory, wherein the memory is configured to:
  read a first set bit values from the first fuse array;
  read a set of redundancy bit values from the first fuse array;
  check the first set of bit values for errors dependent upon the set of redundancy bit values; and
  read at least one bit value from the second fuse array in response to a determination that at least one error is present in the first set of bit values.

15. The system of claim 14, wherein the memory is further configured to generate a final set of data bits dependent upon the first set of bit values and the at least one bit value from the second fuse array.

16. The system of claim 15, wherein the memory is further configured to send the final set of data bits to the controller.

17. The system of claim 14, wherein to generate the final set of data bits dependent upon the first set of bit values and the at least one bit values from the second fuse array, the memory is further configured to perform a bitwise logical-OR operation.

18. The system of claim 14, wherein the set of redundancy bit values include an Error Correction Code (ECC).

19. The system of claim 14, The method of claim 7, wherein the set of redundancy bit values include an Error Detection Code (EDC).

20. The system of claim 14, wherein the first set of bit values includes information indicative of faulty locations in the memory.

* * * * *